United States Patent
Dangel et al.

(10) Patent No.: US 12,205,987 B2
(45) Date of Patent: Jan. 21, 2025

(54) WAFER, OPTICAL EMISSION DEVICE, METHOD OF PRODUCING A WAFER, AND METHOD OF CHARACTERIZING A SYSTEM FOR PRODUCING A WAFER

(71) Applicant: Technische Universität München, Munich (DE)

(72) Inventors: Christian Dangel, Munich (DE); Jonathan Finley, Aschheim (DE); Kai Müller, Eching (DE); Frederik Bopp, Munich (DE); Arne Ludwig, Witten (DE); Nikolai Bart, Bochum (DE); Andreas Wieck, Hattingen (DE)

(73) Assignee: Technische Universität München, Munich (DE)

( * ) Notice: Subject to any disclaimer, the term of this patent is extended or adjusted under 35 U.S.C. 154(b) by 0 days.

(21) Appl. No.: 17/595,738

(22) PCT Filed: May 28, 2020

(86) PCT No.: PCT/EP2020/000104
§ 371 (c)(1),
(2) Date: Nov. 23, 2021

(87) PCT Pub. No.: WO2020/239250
PCT Pub. Date: Dec. 3, 2020

(65) Prior Publication Data
US 2022/0344462 A1    Oct. 27, 2022

(30) Foreign Application Priority Data
May 31, 2019   (EP) .................................... 19177713

(51) Int. Cl.
*H01L 29/778*   (2006.01)
*H01L 21/02*    (2006.01)
*H01L 29/06*    (2006.01)

(52) U.S. Cl.
CPC .... *H01L 29/0665* (2013.01); *H01L 21/02381* (2013.01); *H01L 21/02395* (2013.01);
(Continued)

(58) Field of Classification Search
None
See application file for complete search history.

(56) References Cited

U.S. PATENT DOCUMENTS

| | | | |
|---|---|---|---|
| 10,128,107 B1* | 11/2018 | Cho | H01L 21/02458 |
| 2011/0263108 A1* | 10/2011 | Lan | H01L 21/02057 |
| | | | 438/492 |

FOREIGN PATENT DOCUMENTS

| | | |
|---|---|---|
| CN | 104538524 A | 4/2015 |
| CN | 109417119 A | 3/2019 |

(Continued)

OTHER PUBLICATIONS

Saito, H. "Room-temperature lasing operation of a quantum-dot vertical-cavity surface-emitting laser" App. Phys. Lett. vol. 69, No. 21 published Nov. 18, 1996 pp. 3140-3142 (Year: 1996).*

(Continued)

*Primary Examiner* — Grant S Withers
(74) *Attorney, Agent, or Firm* — Maginot, Moore & Beck, LLP

(57) ABSTRACT

A wafer includes a substrate and at least one intermediate layer formed on a surface of the substrate. The at least one intermediate layer covers the surface of the substrate at least partially. An outer surface of the at least one intermediate layer is directed away from the surface of the substrate. The wafer further includes nanostructures grown on the outer surface of the at least one intermediate layer. The at least one intermediate layer is formed in such a way that positions of growth of the nanostructures are predetermined on the outer surface of the at least one intermediate layer. At least one (Continued)

nanostructure material of the nanostructures is assembled at the positions of growth of the nanostructures.

6 Claims, 11 Drawing Sheets

(52) U.S. Cl.
CPC .... *H01L 21/0245* (2013.01); *H01L 21/02463* (2013.01); *H01L 21/02496* (2013.01); *H01L 29/7786* (2013.01); *H01L 29/7787* (2013.01)

(56) References Cited

FOREIGN PATENT DOCUMENTS

| | | |
|---|---|---|
| EP | 0 427 905 A2 | 5/1991 |
| TW | 201432940 A | 8/2014 |

OTHER PUBLICATIONS

Ledentsov, N "Ordered Arrays of Quantum Dots: Formation, Electronic Spectra, Relaxation Phenomena , Lasing" Solid-State Elec. vol. 40, No. 1-8 copyright 1996 pp. 785-798 (Year: 1996).*
Lee, S. "Effect of wetting layers on the strain and electronic structure of InAs self-assembled quantum dots" Phys. Rev. B 70, 125307 published Sep. 14, 2004 (Year: 2004).*
Glossary of Common Wafer related terms (website glossary available online at cleanroom.byu.edu/glossary-of-common-wafer-related-terms as of Jan. 27, 2024 with prior archived version from Wayback Machine dated Jun. 21, 2021 available at the URL in the Final Office Action) (Year: 2021).*
International Search Report corresponding to PCT Application No. PCT/EP2020/000104, mailed Oct. 6, 2020 (7 pages).
Watanabe, K. et al., "Photoluminescence studies of GaAs quantum dots grown by droplet epitaxy," Journal of Crystal Growth, 2001, vol. 227-228, pp. 1073-1077 (5 pages).
Leon, R. et al., "Dislocation-induced spatial ordering of InAs quantum dots: Effects on optical properties," Journal of Applied Physics, May 2002, vol. 91, No. 9, pp. 5826-5830 (5 pages).
Piva, P.G. et al., "Enhanced degradation resistance of quantum dot lasers to radiation damage," Applied Physics Letters, Jul. 2000, vol. 77, No. 5, pp. 624-626 (3 pages).
Kim, H. J. et al., "Fabrication of wirelike InAs quantum dots on 2°-off GaAs (100) substrates by changing the thickness of the InAs layer," Applied Physics Letters, May 2001, vol. 78, No. 21, pp. 3253-3255 (3 pages).
Atkinson, P. et al., "Formation and ordering of epitaxial quantum dots," Comptes Rendus Physique, 2008, vol. 8, pp. 788-803 (16 pages).
Hendrickson, J. et al., "InAs quantum dot site-selective growth on GaAs substrates," Physica Status Solidi C, 2011, vol. 8, No. 5, pp. 1242-1245 (4 pages).
Bennett, A. J. et al., "Nucleation and ripening of seeded InAs/GaAs quantum dots," Journal of Crystal Growth, 2002, vol. 240, pp. 439-444 (6 pages).
Leon, R. et al., "Nucleation Transitions for InGaAs Islands on Vicinal (100) GaAs," Physical Review Letters, Jun. 1997, vol. 78, No. 26, pp. 4942-4945 (5 pages).
Wang, Z. E. et al., "Persistence of (In,Ga)As quantum-dot chains under index deviation from GaAs (100)," Applied Physics Letters, Jun. 2004, vol. 84, No. 23, pp. 4681-4683 (3 pages).
Bauer, J., "Untersuchungen zum kontrollierten Wachstum von InAs-Nanostrukturen auf Spaltflachen (Investigations Into the controlled growth of InAs nanostructures on cleavage surfaces)," PhD Thesis, 2006 (156 pages).
Okamoto, A. et al., "Selective epitaxial growth of gallium arsenide by molecular beam epitaxy," Applied Physics Letters, Nov. 1987, vol. 51, No. 19, pp. 1512-1514 (3 pages).
Schneider, C. et al., "Single site-controlled In(Ga)As/GaAs quantum dots: growth, properties and device Integration," Nanotechnology, 2009, vol. 20 (9 pages).
Kitajima, T. et al., "Two-dimensional periodic alignment of selfassembled Ge islands on patterned Si(001) surfaces," Applied Physics Letters, Jan. 2002, vol. 80, No. 3, pp. 497-499 (3 pages).
Brault, J. et al., "Linear alignment of GaN quantum dots on AlN grown on vicinal SiC substrates," Journal of Applied Physics, Mar. 2003, vol. 93, No. 5, pp. 3108-3110 (3 pages).
Taiwan office action for corresponding application, mailed Nov. 14, 2023.
English translation of Taiwan office action for corresponding application, mailed Nov. 14, 2023.
Chinese Office Action in corresponding application CN202080040617, mailed Sep. 15, 2024.

* cited by examiner

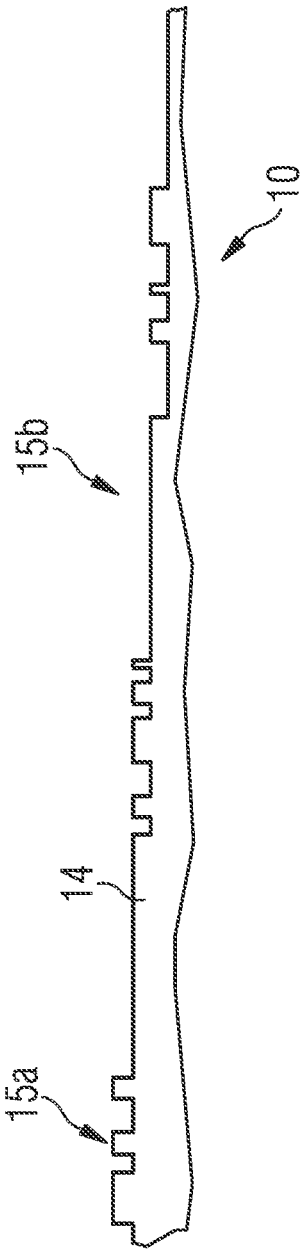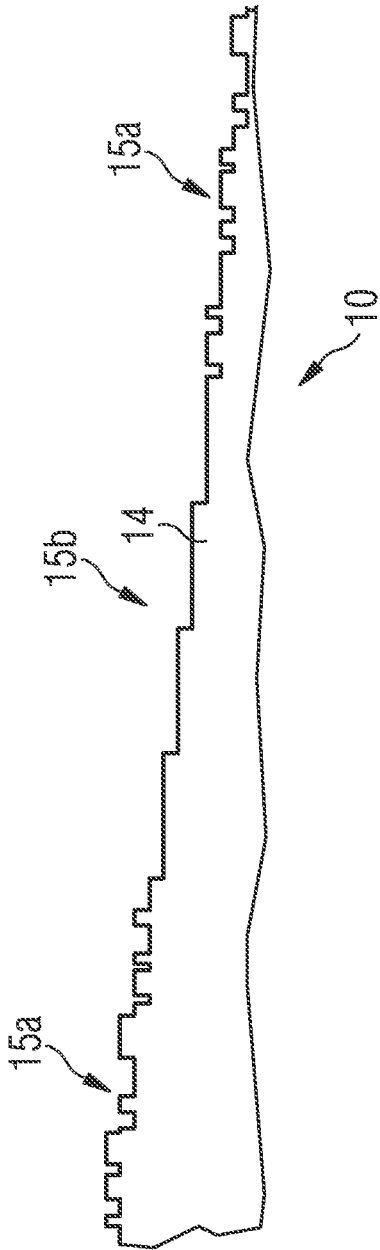

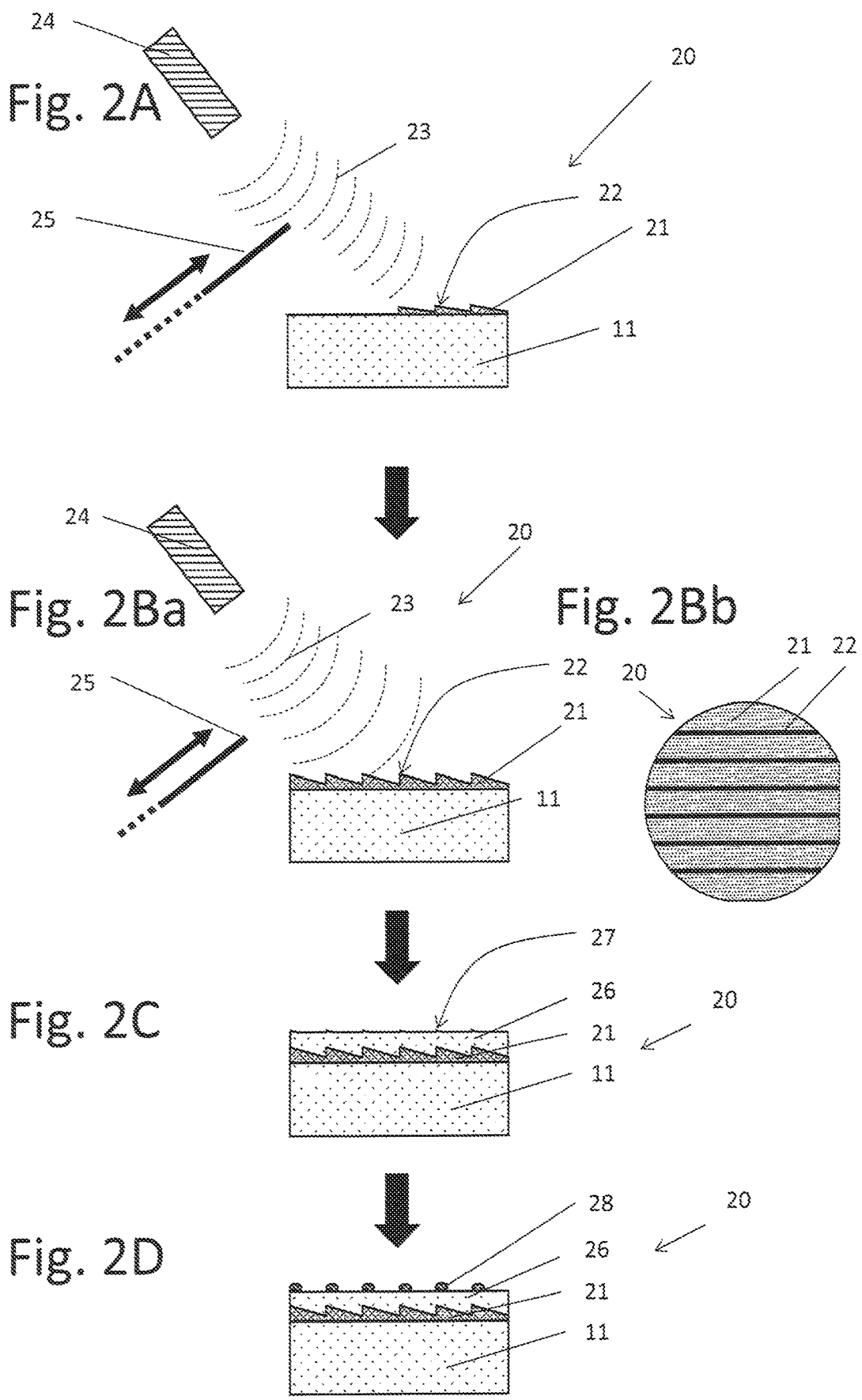

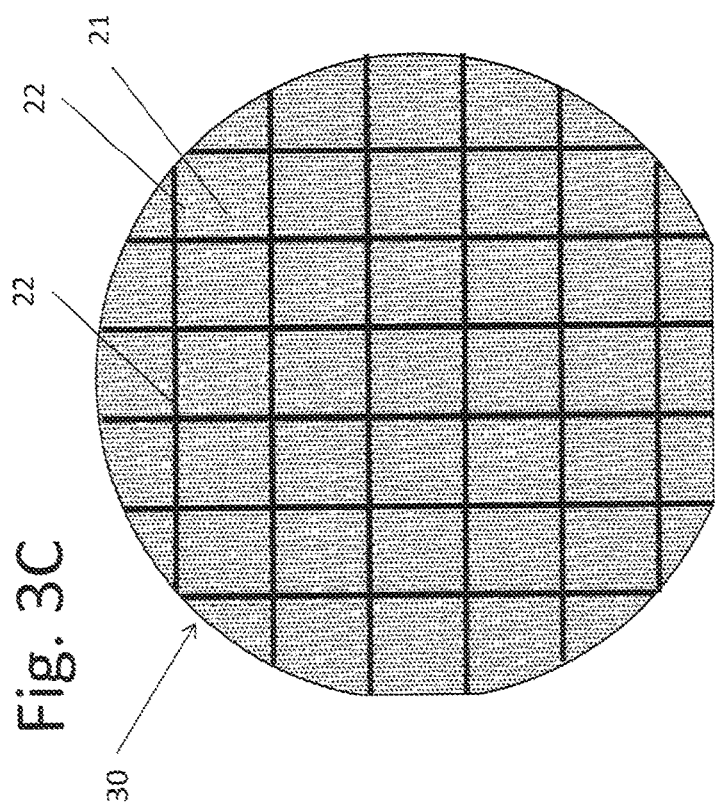
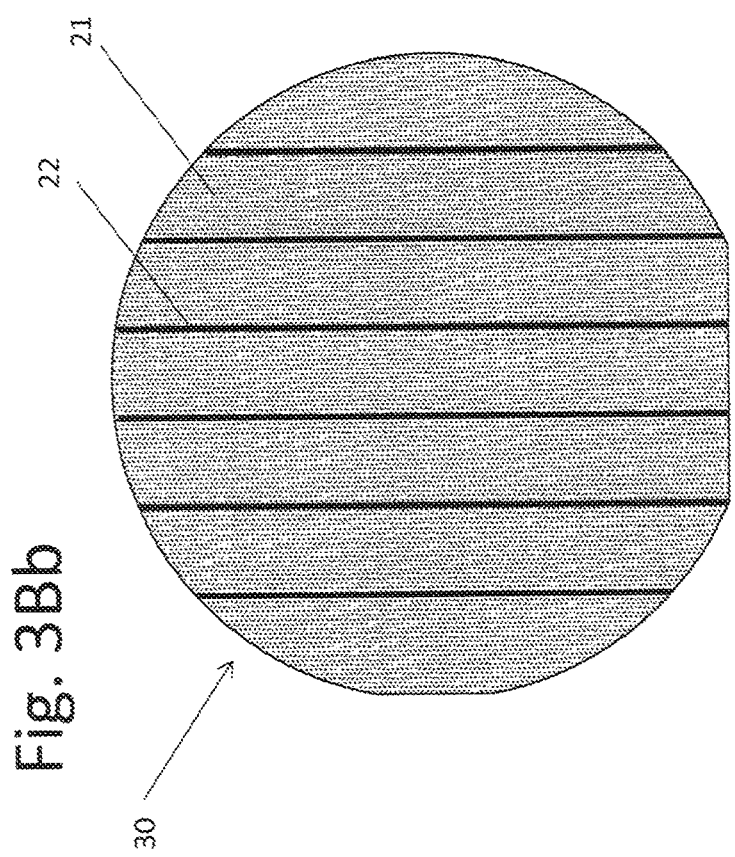

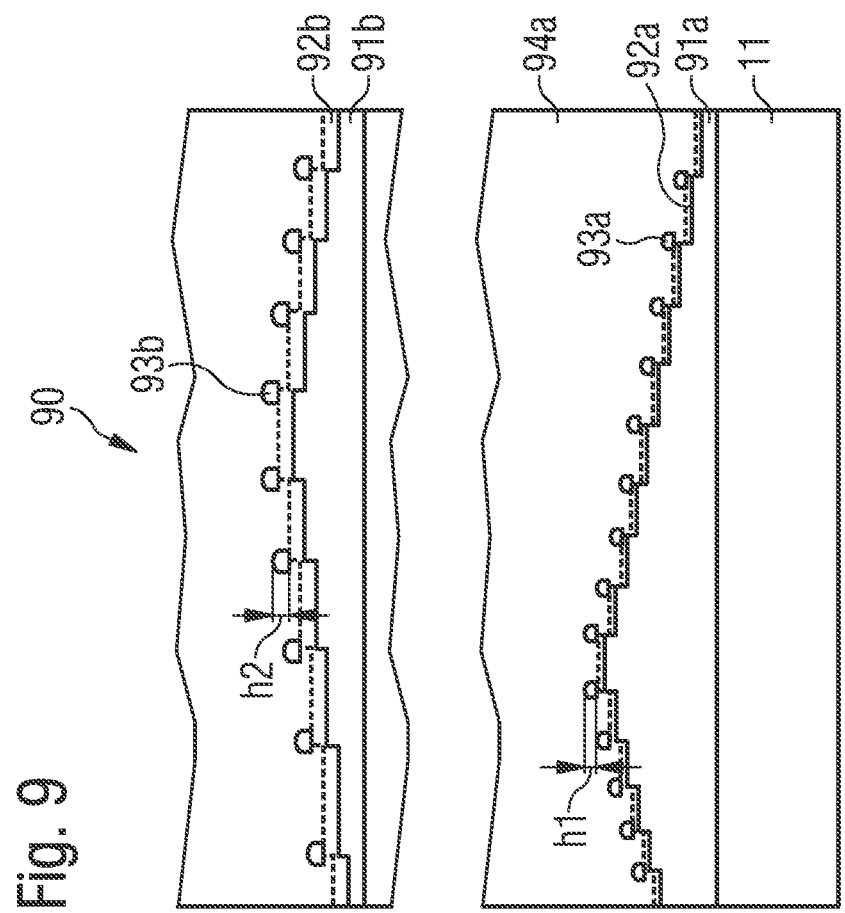

WAFER, OPTICAL EMISSION DEVICE, METHOD OF PRODUCING A WAFER, AND METHOD OF CHARACTERIZING A SYSTEM FOR PRODUCING A WAFER

PRIORITY CLAIM

This application is a national stage filing from and claims priority to PCT/EP2020/000104, filed on May 28, 2020, which claims priority to European Patent Application No. 19177713.5, filed on May 31, 2019, the entire disclosures of which are incorporated herein by reference.

TECHNICAL FIELD

The present invention relates to a wafer and an optical emission device. The invention further relates to a method of producing a wafer and a method of characterizing a system for producing a wafer.

BACKGROUND

CN 104538524 A describes a growth method for growing an epitaxy structure comprising InGaN quantum dots on a substrate that requires a stepped surface of the substrate with a chamfer angle of 0.05° to 0.1° to form the InGaN quantum dots on positions close to the steps of the stepped surface of the substrate.

It is the object of the present invention to provide an improved wafer, an improved growth method, and/or an improved method of characterizing a system for producing a wafer.

SUMMARY

The above-mentioned object is solved by a wafer an optical emission device, a method for producing a wafer and a method of characterizing a system for producing a wafer with the following features:

A wafer comprising: a substrate, at least one intermediate layer formed on a surface of the substrate, wherein the at least one intermediate layer covers the surface of the substrate at least partially, and wherein an outer surface of the at least one intermediate layer is directed away from the surface of the substrate, and nanostructures grown on the outer surface of the at least one intermediate layer, wherein the at least one intermediate layer is formed in such a way that positions of growth of the nanostructures are predetermined on the outer surface of the at least one intermediate layer, and wherein at least one nanostructure material of the nanostructures is assembled at the positions of growth of the nanostructures.

A wafer comprising: a substrate, at least one intermediate layer formed on a surface of the substrate, wherein the at least one intermediate layer covers the surface of the substrate at least partially, and wherein an outer surface of the at least one intermediate layer is directed away from the surface of the substrate, and a wetting layer covering the outer surface of the at least one intermediate layer at least partially, wherein the at least one intermediate layer is formed in such a way that positions of modification of altered subareas of the wetting layer are predetermined on the outer surface of the at least one intermediate layer, and wherein the altered subareas of the wetting layer covering the positions of modification have a different wetting layer thickness and/or a different wetting layer composition than remaining subareas of the wetting layer covering the outer surface of the at least one intermediate layer around the positions of modification so that an optical emission characteristic and/or an electron transport characteristic of the altered subareas of the wetting layer differs from the remaining subareas of the wetting layer.

A method of producing a wafer comprising the steps of: Forming at least one intermediate layer on a surface of a substrate, wherein the surface of the substrate is covered at least partially by the at least one intermediate layer, and wherein an outer surface of the at least one intermediate layer directed away from the surface of the substrate is formed, and growing nanostructures on the outer surface of the at least one intermediate layer, wherein the at least one intermediate layer is formed in such a way that positions of growth of the nanostructures are predetermined on the outer surface of the at least one intermediate layer, and wherein the nanostructures are grown on the outer surface of the at least one intermediate layer by depositing at least one nanostructure material of the later nanostructures on the outer surface of the at least one intermediate layer in such a way that the at least one nanostructure material assembles at the positions of growth of the nanostructures.

A method of producing a wafer comprising the steps of: Forming at least one intermediate layer on a surface of a substrate, wherein the surface of the substrate is covered at least partially by the at least one intermediate layer, and wherein an outer surface of the at least one intermediate layer directed away from the surface of the substrate is formed, and forming a wetting layer covering the outer surface of the at least one intermediate layer at least partially, wherein the at least one intermediate layer is formed in such a way that positions of modification of altered subareas of the wetting layer are predetermined on the outer surface of the at least one intermediate layer, and wherein the altered subareas of the wetting layer covering the positions of modification are formed with a different wetting layer thickness and/or a different wetting layer composition than remaining subareas of the wetting layer covering the outer surface of the at least one intermediate layer around the positions of modification so that an optical emission characteristic and/or an electron transport characteristic of the altered subareas of the wetting layer is altered compared with the remaining subareas of the wetting layer.

The present invention is based on the idea to form at least one intermediate layer in such a way that the positions of growth of nanostructures or the positions of modification of altered subareas of the wetting layer are determined/generated. Using the present invention it is thus not necessary to have a substrate with a stepped surface for growing the nanostructures or modifying the altered subareas of the wetting layer. In opposite to the above-mentioned prior art, a substrate with a flat surface (for instance without miscut) may be used to perform the present invention. It is thus possible to have a chamfered form or a homogeneous average height of the wafer. The present invention thus reduces the costs for growing a wafer with nanostructures and/or altered subareas of its wetting layer. Furthermore, the present invention reduces the requirement for a substrate to be used for growing a wafer with nanostructures or altered subareas of its wetting layer compared to the prior art.

Moreover, the present invention also enables an arrangement of nanostructures of a wafer arbitrarily and independently of the surface of the substrate on/above which the nanostructures are grown. The present invention thus provides a wafer with an arbitrary distribution of its nanostructures with a preferred "pattern" of its nanostructures. Correspondingly, the present invention also provides a wafer with an arbitrary distribution of the altered subareas of its wetting layer or with a preferred "pattern" of the altered subareas of its wetting layer.

In a particularly preferred embodiment of the wafer, the at least one intermediate layer is formed in such a way that compositional or morphological inhomogeneities are formed on the outer surface of the at least one intermediate layer as the positions of growth of the nanostructures or as the positions of modification of the altered subareas of the wetting layer. These compositional or morphological inhomogeneities provide a reliable predetermination of the positions of growth of the nanostructures or of the positions of modification of the altered subareas of the wetting layer. Compositional inhomogeneities of the positions of growth can thus relate to variations of chemical compounds such as atomic elements and molecules. The application of the same or different material may also result in morphological inhomogeneities that may relate e.g. to local changes in the crystal structure. Such modifications often cause a lowering of the critical minimum thickness locally on the positions of growth or positions of modification, which increases the probability of the formation of nanostructures or the modification of the altered subareas of the wetting layer.

In a preferred embodiment of the wafer, the at least one intermediate layer comprises a stack of at least two layers, wherein at least two layers of the stack each have a varying layer thickness perpendicular to the surface of the substrate, and wherein a thickness of the stack perpendicular to the surface of the substrate is constant. This embodiment of the wafer has generally a flat outer surface of its stack directed away from the surface of its substrate. The flat outer surface may possess areas of different degrees of roughness. The different degrees of roughness of the flat outer surface may be used to predetermine the positions of growth of the nanostructures or the positions of modification of the altered subareas of the wetting layer.

In another preferred embodiment of the wafer, at least one intermediate layer comprises a layer with a periodically or arbitrarily varying layer thickness perpendicular to the surface of the substrate. The predetermination of the posi-positions of growth of the nanostructures or of the positions of modification of the altered subareas may thus be caused by an alteration of the roughness of the outer surface due to the periodically or arbitrarily varying layer thickness of the at least one intermediate layer. The periodically or arbitrarily varying layer thickness of the at least one intermediate layer represents a simple way to predetermine the positions of growth of nanostructures and/or the positions of modifications of altered subareas of the wetting layer.

In a preferred embodiment of the wafer, the nanostructures comprise nano-islands, droplets, nano-dashes, nano-rings, nano-posts, nano-wires, nano-ribbons, nano-rods, nano-pillars, quantum dots, biological cells and/or biomolecules. Since the applied process is not limited to any special form of nanostructures, also other nanostructures are thinkable. Moreover, biological cells (e.g. bacteria cells) and biomolecules, such as viruses, antibodies, DNA strands or RNA strands, may be applied to this process as well. In this way, the present invention provides a canonical recipe to arrange laterally such nanostructures. Since the positions of growth and the positions of modifications may possess hydrophobic or hydrophilic characteristics, water drops containing the biological cells and/or biomolecules may be accumulated on the positions of growth and the positions of modification of the altered subareas.

In a preferred embodiment, the wafer comprises at least a first intermediate layer as its at least one intermediate layer, a first plurality of nanostructures, at least a second intermediate layer covering the first plurality of nanostructures and a second plurality of nanostructures grown on an outer surface of the at least one second intermediate layer. Moreover, at least one more plurality of nanostructures may be grown above the second plurality of nanostructures, wherein at least one further intermediate layer is arranged between the at least one more plurality of nanostructures and its at least one adjacent plurality of nanostructures.

In one advantageous embodiment of the wafer, for each of the first plurality of nanostructures one of the second plurality of nanostructures is arranged in a direction perpendicular to the surface of the substrate. This advantageous embodiment therefore represents an example of a three-dimensional structure of a repeated "pattern" of nanostructures. Such an embodiment of the wafer may be applied as a quantum repeater. However, first plurality of nanostructures and the second plurality of nanostructures may also have different spatial distributions.

The above-mentioned advantages may also be employed for an optical emission device with such a wafer, wherein the optical emission device is a laser, an LED, a superradiant LED or a single photon source. For example, a laser locked with a desired spatial mode and a desired wavelength can be produced with such a wafer. An LED or a superradiant LED with a desired spectral distribution may also comprise such a wafer. Furthermore, a single photon source emitting at a desired emission frequency and a desired wavelength may further comprise such a wafer. Such optical emission devices have great applicability in scientific and industrial processes, in life science applications, and/or optical communication networks or quantum communication networks.

In a preferred embodiment of the method of producing a wafer, the nanostructures are grown on the outer surface of the at least one intermediate layer by depositing the at least one nanostructure material of the later nanostructures on the outer surface of the at least one intermediate layer in such a way that the nanostructures are formed by self-clustering, self-assembling, crystallization and/or nucleation of the at least one nanostructure material assembled at the positions of growth of the nanostructures.

The formation process of nanostructures thus does not require any "controlled" deposition of the material. Instead, certain physical effects such as self-clustering, self-assembling, crystallization and/or nucleation may be used for a self-forming of the nanostructures while a simple deposition step is performed. The nanostructures may be grown by Stranski-Krastanov-Growth (Layer-and-Island-Growth), for instance.

Although being statistical in its nature, due to the predetermination of the positions of growth, the nanostructures are formed on the predetermined positions "automatically" while the simple deposition step is performed.

In a preferred embodiment of the method of producing a wafer, the at least one intermediate layer is formed in such a way that compositional or morphological inhomogeneities are formed on the outer surface of the at least one intermediate layer as the positions of growth of the nanostructures or as the positions of modification of the altered subareas of the wetting layer. As will be explained below, the compositional or morphological inhomogeneities may be formed by easily executable process steps.

For instance, forming the at least one intermediate layer with the compositional or morphological inhomogeneities on the outer surface of the at least one intermediate layer comprises the step of: Forming a layer with a periodically or arbitrarily varying layer thickness perpendicular to the surface of the substrate by deposition of at least one material of the layer with periodically or arbitrarily varying layer thickness through openings of a shadow mask on the surface of the substrate or on the other intermediate layer. Employing for instance a shadow mask for the intermediate layer enables to form spatially periodic or arbitrary thickness variations of the intermediate layer. Furthermore, positions of material depositions and its interspaces can be controlled in a direct way. Therefore, the versatility of the distribution of the later formed nanostructure distribution or of the modification of the altered subareas of the later formed wetting layer can be further increased.

In another preferred embodiment of the method of producing a wafer, forming the at least one intermediate layer with the compositional or morphological inhomogeneities on the outer surface of the at least one intermediate layer comprises the step of: Forming a layer with a periodically or arbitrarily varying layer thickness perpendicular to the surface of the substrate by deposition of at least one material of the layer with the periodically or arbitrarily varying layer thickness, wherein a position of a shutter device relative to the substrate is stepwise or continuously changed from an initial position of the shutter device into an end position of the shutter device during the deposition of the at least one material of the layer with the periodically or arbitrarily varying layer thickness, and wherein a first amount of a material flow of the at least one deposited material of the layer with the periodically or arbitrarily varying layer thickness blocked by the shutter device in its initial position is different than a second amount of the material flow of the at least one deposited material of the layer with the periodically or arbitrarily varying layer thickness blocked by the shutter device in its end position. The first amount of the material flow blocked by the shutter device in its initial position may be larger or smaller than the second amount of the material flow blocked by the shutter device in its end position. Employing the shutter device to block a material flow is a simple and inexpensive method for forming the intermediate layer with its periodically or arbitrarily varying layer thickness perpendicular to the surface of the substrate. The shutter device may be a regular shutter or any other suitable device that can block at least partially the molecule flow from a material source such as an effusion cell. For example, periodically or arbitrarily varying thickness variations such as a "sawtooth" structure can be easily formed in this way. Furthermore, the position or the angle of the wafer during the process can be varied to form inhomogeneities in the intermediate layer with its periodically or arbitrarily varying layer thickness in two dimensions. For example, to form a two-dimensional array/grid/lattice structure, a rotation of the wafer may be applied during the process.

Furthermore, the layer with the periodically or arbitrarily varying layer thickness may be covered by a second intermediate layer to form the compositional or morphological inhomogeneities of the second intermediate layer. Thus, it is possible to provide the compositional or morphological inhomogeneities on a flat outer surface of the second intermediate layer.

The inventive method of characterizing a system for producing a wafer comprises the steps of: Producing a wafer using an above-mentioned embodiment of the method of producing a wafer, wherein at least one material of the at least one intermediate layer of the wafer and/or of the nanostructures of the wafer is deposited by at least one material source of the system; and performing at least one measurement on the nanostructures of the produced wafer to determine a flux density distribution of the at least one material source of the system.

In a preferred embodiment of the method of characterizing a system for producing a wafer, a layer thickness distribution of the at least one intermediate layer is investigated by the at least one measurement and the flux density distribution of the at least one material source of the system is determined based on the detected layer thickness distribution of the at least one intermediate layer. Since the material source, such as an effusion cell, typically emits material with an uneven flux density (for instance a radial emission inhomogeneity and/or an uneven flux density caused by an angle of the material source with regard to the substrate), a layer deposited by such a material source thus has a varying layer thickness according to the flux density variation. By subsequent formation of the nanostructures, it is possible to determine the layer thickness. Thus, the layer thickness provides information about the flux of the material source. Knowing the flux density of the material source helps to produce perfectly flat layers, or, if desired, to produce layers with arbitrary thickness profiles from scratch.

In another preferred embodiment of the method of characterizing a system for producing a wafer, the wafer is formed with at least a first intermediate layer as its at least one intermediate layer, a first plurality of nanostructures with a first physical and/or chemical property as its nanostructures, at least a second intermediate layer covering the first plurality of nanostructures and a second plurality of nanostructures with a second physical and/or chemical property different from the first physical and/or chemical property grown on an outer surface of the at least one second intermediate layer, wherein at least a first material source of the system is used to deposit the first intermediate layer and at least a second material source is used to deposit the second intermediate layer, and wherein the at least one measurement comprises a first measurement on the first plurality of nanostructures to determine the flux density distribution of the first material source and a second measurement on the second plurality of nanostructures to determine the flux density distribution of the second material source.

In this way, the characterization of different material sources can be performed very efficiently with subsequent measurements on the same wafer. Physical properties of the nanostructures may be the size parallel or perpendicular to the surface of the substrate, the volume, the shape, crystal structures, temperature or any other physical properties. Chemical properties of the nanostructures may be the composition of the applied material, alloys, or isotopes, their molecular structure or any other chemical properties. The measurement may be performed by, but is not limited to, a photoluminescence measurement. Moreover, the first meas-measurement and the second measurement may be performed simultaneously. In case that at least one third measurement is also performed, the at least one third measurement may be performed simultaneously with the first measurement and/or the second measurement.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

BRIEF DESCRIPTION OF THE DRAWINGS

The present invention is described in greater detail in the following on the basis of the embodiments shown in the schematic figures of the drawings, in which:

FIG. 1A to 1F show cross sections of a layer composition for illustrating a first embodiment of the method of producing a wafer;

FIG. 2A to 2D show cross sections and a top view of another layer composition for illustrating a second embodiment of the method of producing a wafer;

FIG. 3A to 3D show cross sections and top views of another layer composition for illustrating a third embodiment of the method of producing a wafer;

FIG. 9 shows a wafer that may be used to perform the method described above.

Figure 1A:
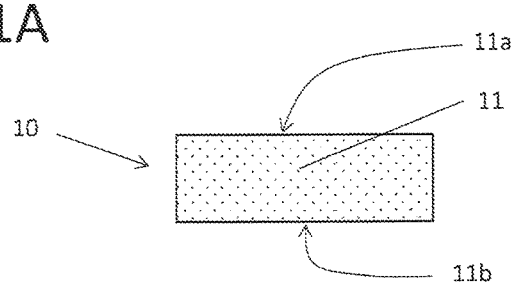

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION

FIG. 1A to 1F show cross sections of a layer composition for illustrating a first embodiment of the method of producing a wafer 10.

As shown in FIG. 1A, a substrate 11 is provided. By performing the method of producing a wafer 10, a surface 11a of the substrate 11 is covered at least partially by at least one intermediate layer 12 to 14. Preferably, the surface 11a of the substrate 11, on which the at least one intermediate layer 12 to 14 is grown, is a flat surface 11a. Thus, preferably, a thickness of the substrate 11 perpendicular to the surface 11a is constant. Another surface 11b of the substrate 11 directed away from the surface 11a, on which the at least one intermediate layer 12 to 14 is grown, may also be flat. Furthermore, the substrate 11 may be formed of a large variety of different materials, e.g. at least one semiconductor material such as silicon and/or gallium arsenide. Thus, a large variety of different types of substrates may be used as the substrate 11. The method of producing a wafer 10 can therefore be performed by using a rather "inexpensive" substrate 11.

The method of producing a wafer 10 can be carried out by using a "smaller" or a "larger" substrate 11. Exemplary, a diameter of the substrate 11 may be at least 50 mm, for instance at least 75 mm, even at least 100 mm.

Figure 1B:
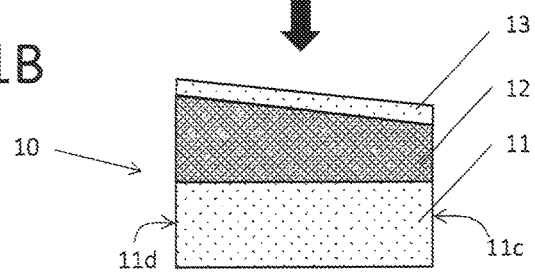

As shown in FIG. 1B, a basic intermediate layer 12 is formed on the surface 11a of the substrate 11. Exemplary, the basic intermediate layer 12 is formed with a varying layer thickness perpendicular to the surface 11a of the substrate 11. In the example of FIG. 1B, the layer thickness of the basic intermediate layer 12 perpendicular to the surface 11a of the substrate 11 increases constantly from a first side 11c of the substrate 11 to a second side 11d of the substrate 11 directed away from the first side 11c. Then, a covering intermediate layer 13 may be formed on a surface of the basic intermediate layer 12 which is directed away from the surface 11a of the substrate 11. The covering intermediate layer 13 may have a constant or varying layer thickness perpendicular to the surface 11a of the substrate 11.

Figure 1C:
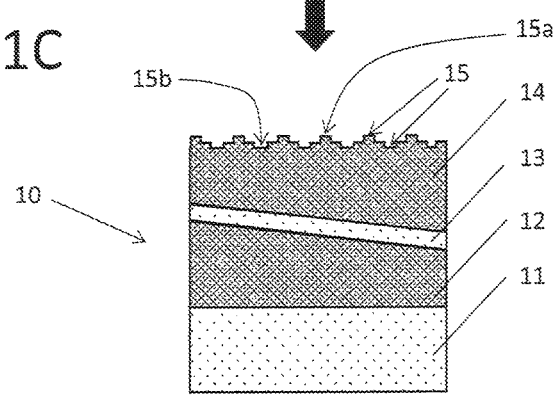

As shown in FIG. 1C, an outer intermediate layer 14 is then formed on the surface of the covering intermediate layer 13 which is directed away from the surface 11a of the substrate 11. Preferably, the outer intermediate layer 14 is formed with a varying layer thickness perpendicular to the surface 11a of the substrate 11. In the example of FIG. 1C, the layer thickness of the outer intermediate layer 14 perpendicular to the surface 11a of the substrate 11 increases constantly from the second side 11d of the sub-substrate 11 to the first side 11c of the substrate 11. Thus, a stack of the intermediate layers 12 to 14 is formed, wherein a thickness of the stack perpendicular to the surface 11a of the substrate 11 is (generally) constant.

However, an outer surface 15 of the intermediate layers 12 to 14 directed away from the surface 11a of the substrate 11 is formed that has a varying roughness with areas 15a of the outer surface 15 having a higher roughness and areas 15b of the outer surface 15 having a lower roughness.

The flat outer surface 15 of the outer intermediate layer 14 thus has areas 15a and 15b of different degrees of surface roughness. The different degrees of surface roughness of the flat outer surface 15 of the outer intermediate layer 14 may be caused by different densities of steps of atomic monolayers.

FIG. 1D shows an example of a part of such an outer intermediate layer 14 comprising the areas 15a of the outer surface 15 having a higher roughness (or a "rough" surface) and the remaining areas 15b having a lower roughness (or a "smooth" surface).

FIG. 1E shows another example of a part of such an outer intermediate layer 14. FIG. 1E represents a situation of an unavoidable/intentional wafer miscut.

Figure 1F:
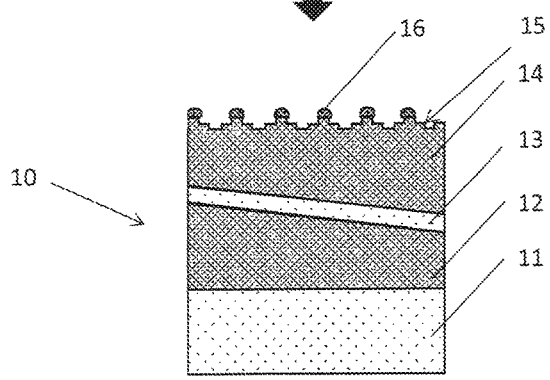

As shown in FIG. 1F, nanostructures 16 are then grown on the outer surface 15 of the at least one intermediate layer 12 to 14. As can be seen in FIG. 1F, the at least one intermediate layer 12 to 14 is formed in such a way that positions of growth 15a of the nanostructures 16, for instance the areas 15a of the outer surface 15 having a higher roughness, are predetermined on the outer surface 15 of the at least one intermediate layer 12 to 14. The nanostructures 16 are grown on the outer surface 15 of the at least one intermediate layer 12 to 14 by simply depositing at least one nanostructure material of the later nanostructures 16 on the outer surface 15 of the at least one intermediate layer 12 to 14 in such a way that the at least one nanostructure material assembles at the positions of growth 15a of the nanostructures 16. Preferably, the nanostructures 16 are grown on the outer surface 15 of the at least one intermediate layer 12 to 14 by depositing the at least one nanostructure material in such a way that the nanostructures 16 are formed by self-clustering, self-assembling, crystallization and/or nucleation of the at least one nanostructure material assembled at the positions of growth 15a of the nanostructures 16. The nanostructures may be grown by Stranski-Krastanov-Growth (Layer-and-Island-Growth), for instance. A comparison of FIGS. 1E and 1F emphasizes specifically that the roughness (compositional or morphological inhomogeneities) is the driving factor for the alignment of nanostructures 16.

Thus, the wafer 10 shown in FIG. 1F is produced. The wafer 10 comprises the substrate 11, the at least one intermediate layer 12 to 14 formed on the surface 11a of the substrate 11, wherein the at least one intermediate layer 12 to 14 covers the surface 11a of the substrate 11 at least partially. The outer surface 15 of the at least one intermediate layer 12 to 14, which is directed away from the surface 11a of the substrate 11, has nanostructures 16 grown on the outer surface 15. As is explained above, the at least one intermediate layer 12 to 14 is formed in such a way that the positions of growth 15a of the nanostructures 16 are predetermined on the outer surface 15 of the at least one intermediate layer 12 to 14, wherein the at least one nanostructure material of the nanostructures 16 is assembled at the positions of growth 15a of the nanostructures 16. Accordingly, the wafer 10 can be produced by carrying out easily performable process steps. Thus, the wafer 10 may have a chamfered form (by omitting the method step of FIG. 1B) or a homogenous average height.

The at least one intermediate layer 12 to 14 may be formed by a molecular beam epitaxial (MBE) process. At least one material of the at least one intermediate layer 12 to 14 may be deposited by a material source (not shown in FIG. 1A to 1F), such as e.g. an effusion cell. As the at least one material of the at least one intermediate layer 12 to 14, preferably gallium arsenide is applied, but other materials and composition are applicable as well, such as indium gallium arsenide, aluminium gallium arsenide, indium arsenide or any other suitable III-V compositions or other compositions of semiconductors, such as silicon and germanium, for instance.

FIG. 2A to 2D show cross sections and a top view of another layer composition for illustrating a second embodiment of the method of producing a wafer 20.

In this embodiment, a basic intermediate layer 21 including inhomogeneities 22 is formed by modulating a molecular beam 23 of a material source 24 by a shutter device 25. In FIG. 2A, the shutter device 25 is positioned in such a way that it partially blocks the molecular beam 23. This results in a modulated thickness of the basic intermediate layer 21, which includes the inhomogeneities 22. The inhomogeneities 22 can be of any kind of compositional or morphological inhomogeneities.

FIG. 2Ba shows the shutter device 25 in its final position. Exemplary, the final position of the shutter device 25 is an "open" position, wherein the molecular beam 23 is unblocked by the shutter device 25 arranged in its "open" position. As an example, a sawtooth-shaped thickness profile of the basic intermediate layer 21 is formed. However, any other periodically or arbitrarily varying layer thickness profile of the basic intermediate layer 21 is also applicable.

In the top view of FIG. 2Bb, the linear spatial extension of the inhomogeneities 22 due to the modulation with the shutter device 25 is shown.

A covering intermediate layer 26 is then formed on the basic intermediate layer 21, as is shown in FIG. 2C. The covering intermediate layer 26 is formed with a plurality of positions of growth 27 that are located directly "above" the positions of the inhomogeneities 22. "Above" means the direction perpendicular to the surface 11a of the substrate 11 and directed away from the substrate 11.

As will become apparent below, the performance of the method of producing a wafer does not require the formation of the covering intermediate layer 26. Instead, the inhomogeneities 22 may also be used as positions of growth 27 in certain embodiments.

In a next step, shown in FIG. 2D, a plurality of nanostructures 28 are formed, for instance as quantum dots 28. The nanostructures 28 are formed preferably by another MBE process, wherein the same or another material is depos-deposited onto the outer surface of the covering intermediate layer 26. The plurality of nanostructures/quantum dots 28 are formed on the positions of growth 27. The nanostructure/quantum dots 28 may be grown on the positions of growth 27 by e.g. nucleation, self-clustering or crystalline growth.

Due to the characteristics of the inhomogeneities 22 in the thickness profile of the basic intermediate layer 21 a statistical uncertainty of the positions of growth 27 is minimal/negligible. Therefore, a reliable placement of the nanostructures/quantum dots 28 independent of the form of the surface 11a of the substrate 11 is possible.

Further characteristics of the method steps of the method of FIG. 2A to 2D and additional features of the wafer 20 produced by said method are described above with regard to the embodiment of FIG. 1A to 1F.

FIG. 3A to 3D show cross sections and top views of another layer composition for illustrating a third embodiment of the method of producing a wafer 30.

Figure 3A:
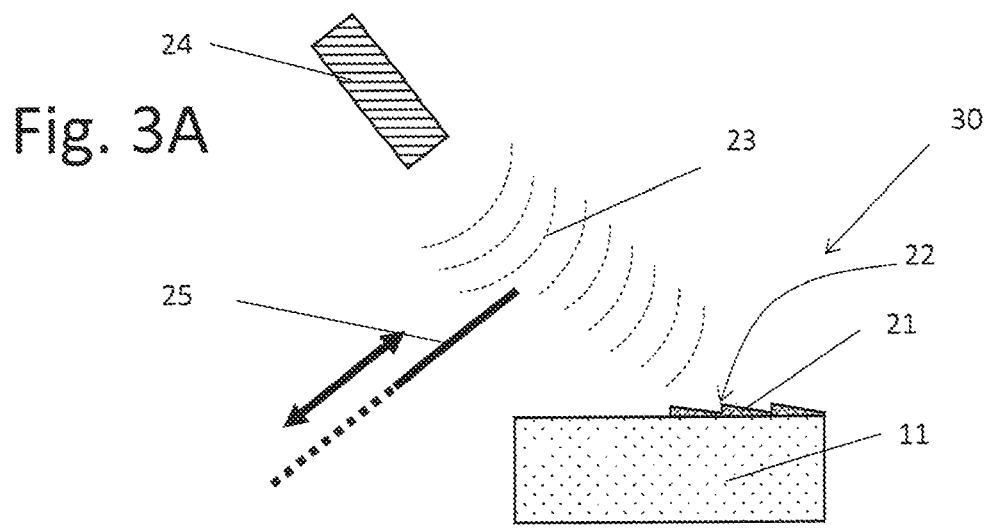
Figure 3B:
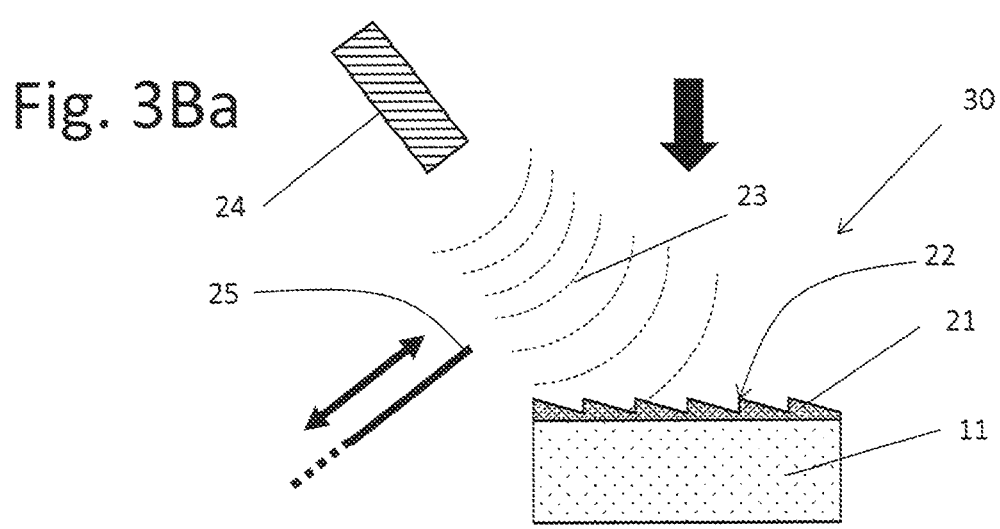

FIGS. 3A, 3Ba and 3Bb show the fabrication of a basic intermediate layer 21 on the outer surface of the substrate 11 with a modulated molecular beam 23. This process is conducted according to FIGS. 2A and 2B.

In the production step shown in FIG. 3C, the wafer 30 is rotated by 90° compared to its arrangement during the Method step shown in FIG. 3Ba while a similar material deposition was applied. As a result, a two-dimensional grating-like structure of inhomogeneities 22 has been realized.

Figure 3D:
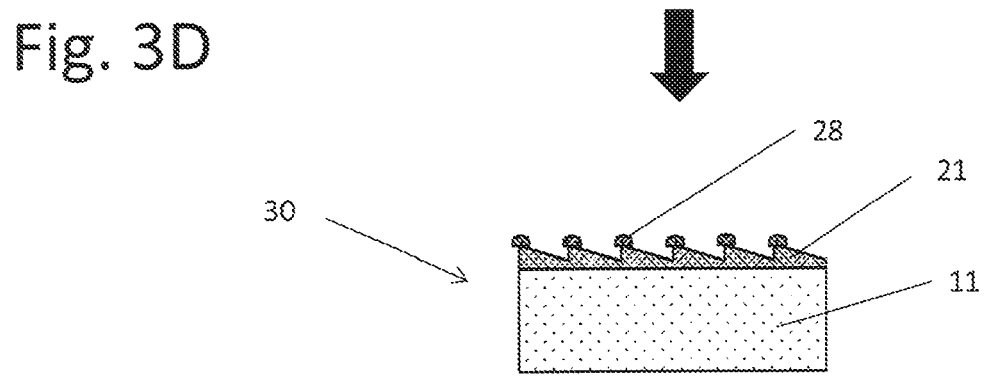

As shown in FIG. 3D, quantum dots 28 are grown on top of the inhomogeneities 22 that function similar to the positions of growth 27 of FIG. 2C. Of course, it is also possible to cover the inhomogeneities 22 with a covering intermediate layer 26 to provide the positions of growth 27 on the outer surface of said covering intermediate layer 26.

Further characteristics of the method steps of the method of FIG. 3A to 3D and additional features of the wafer 30 produced by said method are described above with regard to the preceding embodiments.

FIG. 4A to 4D show cross sections of another layer composition for illustrating a fourth embodiment of the method of producing a wafer 40.

Figure 4A:
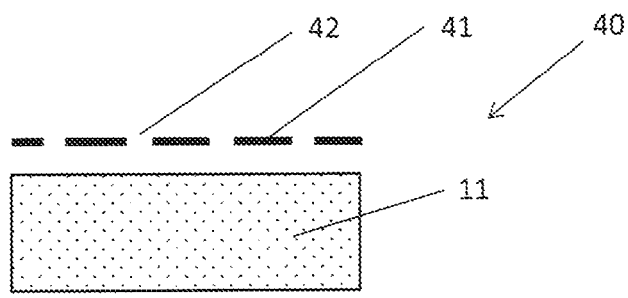
FIG. 4A to 4D show cross sections of another layer composition for illustrating a fourth embodiment of the method of producing a wafer.
Figure 4B:
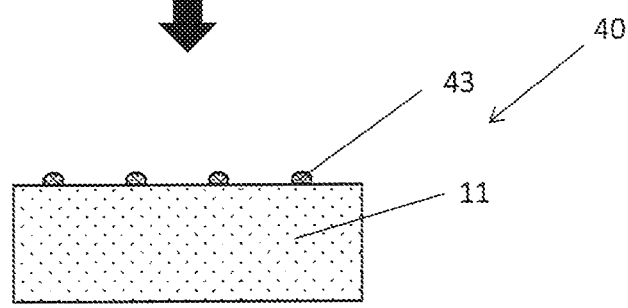

FIG. 4A shows the substrate 11 on which a shadow mask 41 with openings 42 is arranged. Thus, a first material deposition is performed, wherein material 43 is deposited on positions of a surface 11a of the substrate 11 determined by the openings 42 of the shadow mask 42. FIG. 4B shows the wafer 40 after the first material deposition.

Figure 4C:
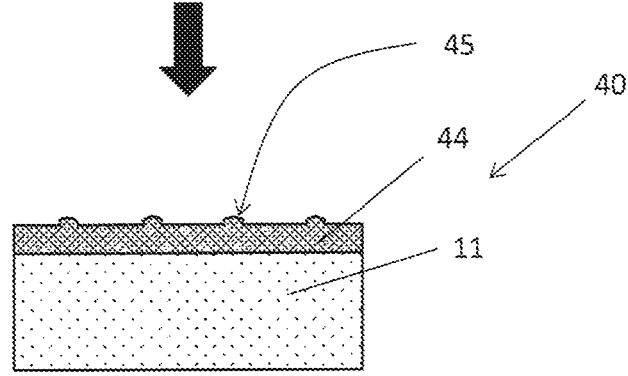

FIG. 4C shows the wafer 40 after an (optional) additional material deposition for forming a basic intermediate layer 44. The basic intermediate layer 44 is formed with inhomogeneities 45 on its outer surface at positions determined by the deposited material 43. Thus, an arbitrary distribution or a pattern of inhomogeneities 45 on the outer surface of the basic intermediate layer 44 can be chosen simply by selecting an appropriate shadow mask 41. The inho-inhomogeneities 45 determine positions of growth 45 of later formed nanostructures 28.

Figure 4D:
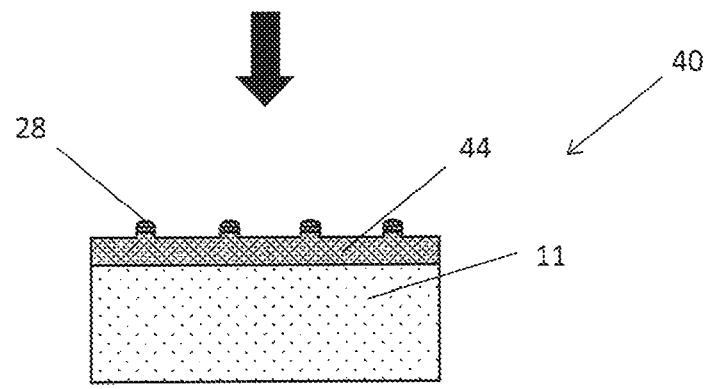

In FIG. 4D, the wafer 40 is shown after the growth of the plurality of nanostructures 28, e.g. as quantum dots 28. The nanostructures/quantum dots 28 are grown on the inhomogeneities/position of growth 45 of the basic intermediate layer 44. Alternatively to the plurality of quantum dots 28, other nanostructures 28 could be grown with the same process.

However, the basic intermediate layer 44 may also be omitted. In this case, the nanostructures/quantum dots 28 are grown directly on the material 43 deposited on positions of the surface 11a of the substrate 11.

Further characteristics of the method steps of the method of FIG. 4A to 4D and additional features of the wafer 40 produced by said method are described above with regard to the preceding embodiments.

FIG. 5A to 5D show cross sections of another layer composition for illustrating a fifth embodiment of the method of producing a wafer 50.

Figure 5A:
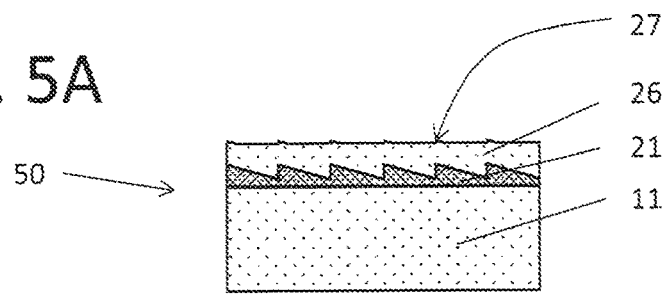
FIG. 5A to 5D show cross sections of another layer composition for illustrating a fifth embodiment of the method of producing a wafer.
Figure 5B:
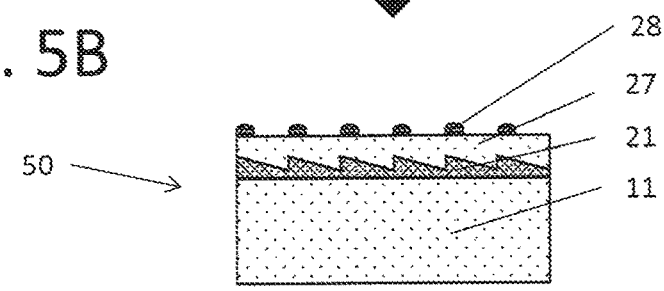

The production steps of FIGS. 5A and 5B are performed according to the method of FIG. 2A to 2D. Alternatively, the production step of FIG. 3C may also be carried out.

Figure 5C:
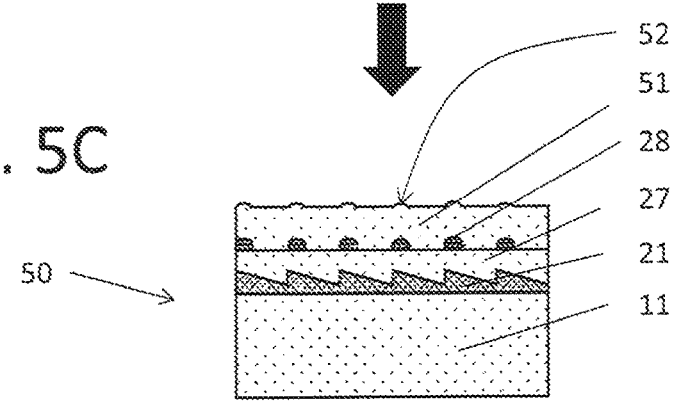
Figure 5D:
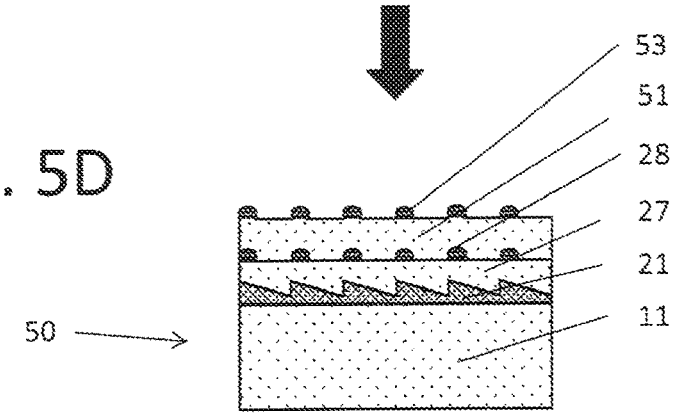

In FIG. 5C, a second covering intermediate layer 51 is applied which possesses inhomogeneities 52 or the like on its outer surface to function as position of growth 52. In this embodiment, the thickness of the second covering interintermediate layer 51 is less than 30 nm, preferably less than 15 nm, especially less than 10 nm. Thus, the second covering intermediate layer 51 is (automatically) formed with the advantageous inhomogeneities 52 as positions of growth 52. Then, a second plurality of quantum dots 53 is grown on the inhomogeneities/positions of growth 52 on the outer surface of the second covering intermediate layer 51. Thus, the second plurality of quantum dots 51 is grown on a position directly above (i.e. perpendicular to the outer surface of the substrate 11) the first plurality of quantum dots 28. This preferred arrangement is particularly useful for the use as a quantum repeater.

Further characteristics of the method steps of the method of FIG. 5A to 5D and additional features of the wafer 50 produced by said method are described with regard to the embodiments above.

The methods described above can also be carried out to produce a wafer with a wetting layer covering the outer surface of the at least one intermediate layer of said wafer at least partially, wherein the at least one intermediate layer is formed in such a way that positions of modification of altered subareas of the wetting layer are predetermined on the outer surface of the at least one intermediate layer, and wherein the altered subareas of the wetting layer covering the positions of modification are formed with a different wetting layer thickness and/or a different wetting layer composition than remaining subareas of the wetting layer covering the outer surface of the at least one intermediate layer around the positions of modification so that an optical emission characteristic and/or an electron transport characteristic of the altered subareas of the wet-wetting layer is altered compared with the remaining subareas of the wetting layer.

Figure 6A:
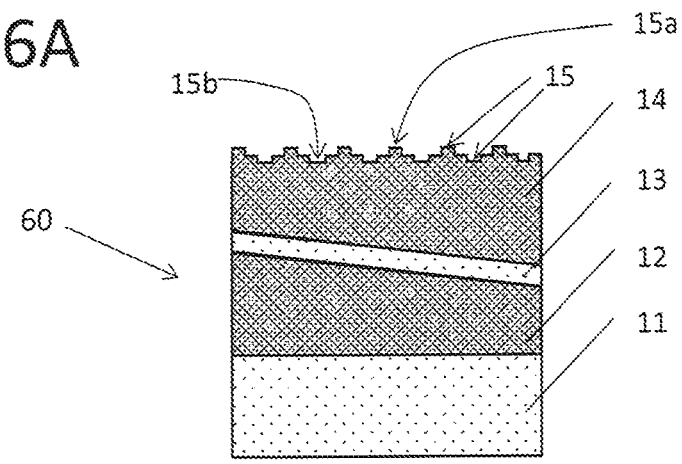
FIGS. 6A and 6B show cross sections of another layer composition for illustrating a sixth embodiment of the method of producing a wafer.
Figure 6B:
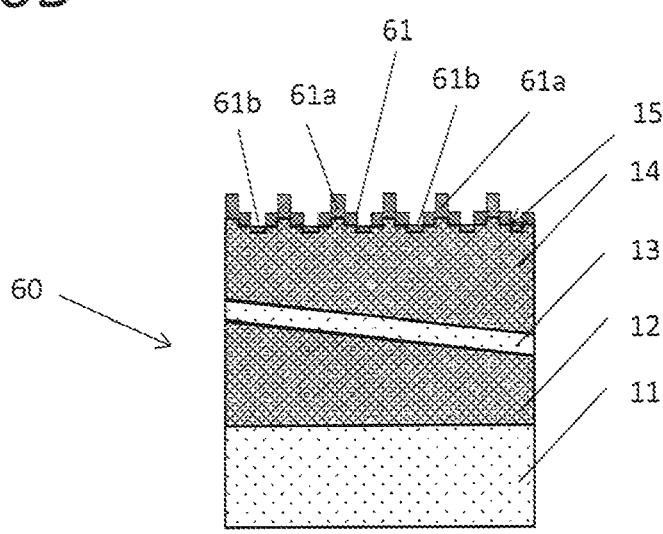

FIGS. 6A and 6B show cross sections of another layer composition for illustrating a sixth embodiment of the method of producing a wafer.

First, the method steps schematically shown in FIG. 1A to 1C are performed. The result is shown in FIG. 6A. The flat outer surface 15 of the outer intermediate layer 14 thus has areas 15a and 15b of different degrees of surface roughness, for instance.

Then, as shown in FIG. 6B, a wetting layer 61 is formed on the outer surface 15 of the at least one intermediate layer 12, 13 and 14. As the at least one intermediate layer 12, 13 and 14 is formed in such a way that positions of modification 15a of altered subareas 61a of the wetting layer 61 are predetermined on the outer surface 15, the altered subareas 61a of the wetting layer 61 covering the positions of modification 15a are formed with a different wetting layer thickness than remaining subareas 61b of the wetting layer 61 covering the outer surface 15 around the positions of modification 15a. Thus, an optical emission characteristic and/or an electron transport characteristic of the altered subareas 61a of the wetting layer 61 is altered compared with the remaining subareas 61b of the wetting layer 61.

Figure 7:
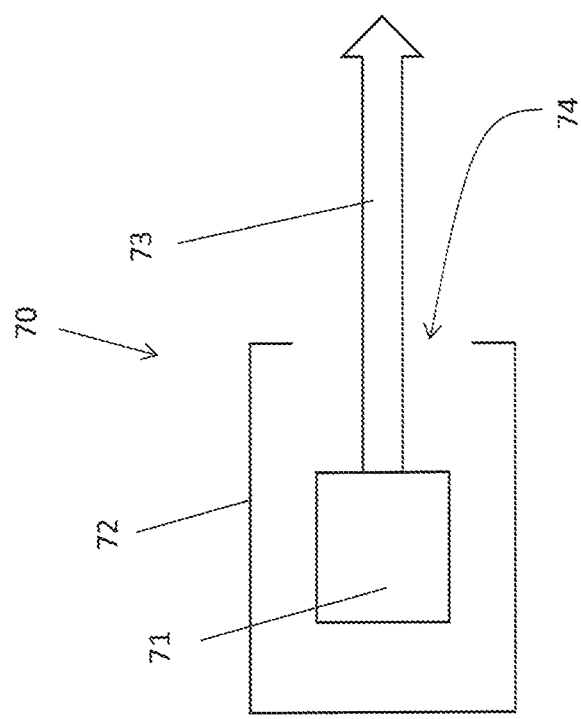
FIG. 7 shows an embodiment of the optical emission device.

The produced wafer 60 therefore comprises a substrate 11, at least one intermediate layer 12, 13 and 14 formed on the surface 11a of the substrate 11, wherein the at least one intermediate layer 12, 13 and 14 covers the surface 11a of the substrate 11 at least partially, and wherein an outer surface 15 of the at least one intermediate layer 12, 13 and 14 is directed away from the surface 11a of the substrate 11. The produced wafer 60 also has a wetting layer 61 covering the outer surface 15 of the at least one intermediate layer 12, 13 and 14 at least partially, wherein the at least one intermediate layer 12, 13 and 14 is formed in such a way that positions of modification 15a of altered subareas 61a of the wetting layer 61 are predetermined on the outer surface 15 of the at least one intermediate layer 12, 13 and 14, and wherein the altered subareas 61a of the wetting layer covering the positions of modification 15a have a different wetting layer thickness and/or a different wetting layer composition than remaining subareas 61b of the wetting layer 61 covering the outer surface 15 of the at least one intermediate layer 12, 13 and 14 around the positions of modification 15a so that an optical emission characteristic and/or an electron transport characteristic of the altered subareas 61a of the wetting layer 61 differs from the remaining subareas 61b of the wetting layer 61. FIG. 7 shows an embodiment of the optical emission device 70.

The optical emission device 70 is shown in FIG. 7. A wafer 71 produced according to any of the previous embodiments is placed into a housing 72 of the optical emission device 70. Exemplary, the wafer 71 emits an optical beam 73 of photons that passes through an opening 74 of the housing 72. The optical emission device 70 can be configured as a laser, an LED, a superradiant LED, a single photon source, or any other optical device emitting photons.

Figure 8B:
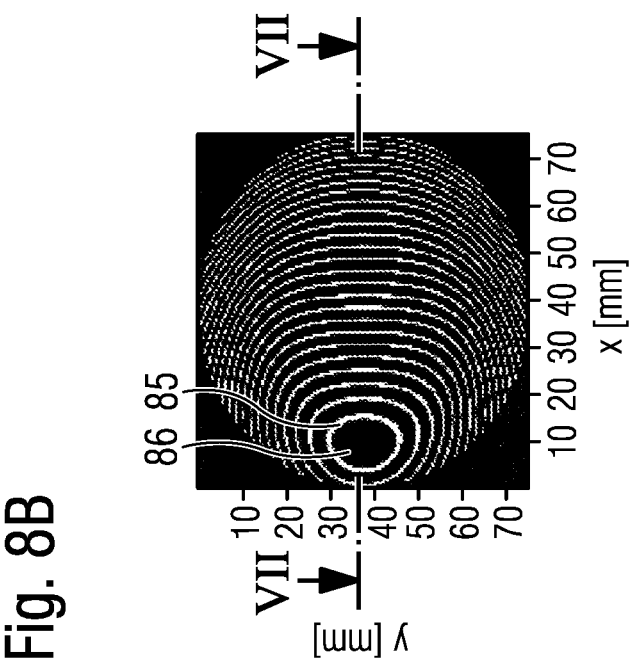
FIGS. 8A and 8B show a schematic illustration and a simulation result for illustrating another embodiment of the method of characterizing a system for producing a wafer.
Figure 8A:
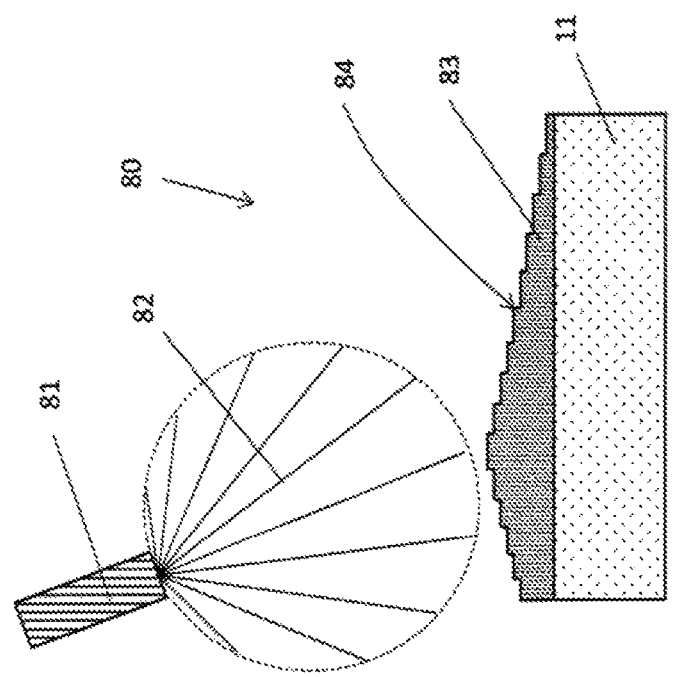

FIGS. 8A and 8B show a schematic illustration and a simulation result for illustrating another embodiment of the method of characterizing a system for producing a wafer 80.

As is shown in FIG. 8A, first a wafer 80 is produced according to any of the methods described above. The wafer 80 may thus be formed according to any of the wafers 10, 20, 30, 40, 50 and 70. At least one material of the at least one intermediate layer 83 of the wafer 80 and/or of its (not shown) nanostructures is deposited by at least one material source 81 of the system. Due to the (in general) angular dependent flux density of the molecular beam 82 emitted by the at least one material source 81, the thickness profile of the at least one intermediate layer 83 is not perfectly flat but possesses areas of enhanced roughness 84, for instance areas of enhanced concentration of monolayer steps 84. These areas of enhanced roughness 84 are utilized as the positions of growth 84 of the (not shown) nanostructures, such as e.g. the quantum dots. Instead of the growth of the nanostructures, the above-mentioned wetting layer comprising the altered subareas may also be formed.

After the growth of the nanostructure/quantum dots on the positions of growth 84 (or after the growth of the wetting layer comprising the altered subareas), at least one measurement is performed on the nanostructures (or on the altered subareas) of the produced wafer 80 to determine the flux density distribution of the at least one material source 81 of the system. For instance, at least one photoluminescence measurement of the wafer 80 may be performed.

The result of a step distribution simulation is shown in the FIG. 8B. The bright fringes 85 show the places of grown quantum dots which corresponds to one area of enhanced roughness 84 of the basic intermediate layer 83 while the dark regions 86 correspond to flat areas of the basic intermediate layer 83.

Information received by the measurement on the produced wafer 80 is then used to determine the flux density of the at least one material source 81. Preferably, the at least one material source 81 of the investigated system is an effusion cell but can also be any other type of suitable material source.

Knowing the flux density of the at least one material source 81 allows substantially improving an epitaxial process performed by the system. For example, the amount and spatial distribution of the deposition of the material can be adapted to the known flux density of the at least one material source 81 in order to form a perfectly flat wafer surface. Furthermore, an arbitrary thickness profile can be formed with an accuracy of down to one monolayer. The device output per wafer can be maximized by the method described above.

FIG. 9 shows a second example of a wafer 90 that may be used to perform the method described above.

The wafer 90 shown in FIG. 9 comprises a first basic intermediate layer 91a formed by a first material source (not shown in FIG. 9) having a first uneven flux density (for instance a radial emission inhomogeneity and/or an uneven flux density caused by an angle of the material source with regard to the substrate). The first basic inter-intermediate layer 91a has a first thickness profile with a first plurality of monolayer steps. The first basic intermediate layer 91a is covered by a first covering layer 92a with such a small thicknesses that the monolayer scale roughness of the first basic intermediate layer 91a are still present on the outer surface of the first covering intermediate layer 92a, on which a first plurality of quantum dots 93a with a first medium height h1 is grown. This structure is covered by a spacing intermediate layer 94a with a flat surface directed away from the first plurality of quantum dots 93a.

Then, a second basic intermediate layer 91b is formed on the spacing intermediate layer 94a by a second material source (not shown in FIG. 9) having a second uneven flux density (for instance a radial emission inhomogeneity and/or an uneven flux density caused by an angle of the material source with regard to the substrate). The second basic intermediate layer 91b has a second thickness profile having a second plurality of monolayer steps. A second covering layer 92b is formed on the second basic intermediate layer 91b, wherein the second covering layer 92b has such a small thicknesses that the areas of monolayer scale roughness of the second basic intermediate layer 91b are still present on the outer surface of the second covering intermediate layer 92b. A second plurality of quantum dots 93b with a second medium height h2 different from the first medium height h1 is formed on the outer surface of the second covering intermediate layer 92b.

The basic intermediate layers 91a and 91b are formed by using two different material sources, whose flux density is to be determined. The covering intermediate layers provide positions of growth for the first and second plurality of quantum dots 93a and 93b. The spacing intermediate layers 94a and 94b are preferably thick enough to provide a flat surface with no inhomogeneities or other irregularities.

The advantage of the wafer 90 is that a flux density of two different material sources can be measured with only the single wafer 90 in two subsequent or parallel conducting photoluminescence measurements. This is due to the two sets of quantum dots 93a and 93b with different medium heights h1 and h2 which can, after excitation, emit two different optical wavelengths, which can be detected separately.

Although only two sets of a structure of plurality of quantum dots are shown, more than two layers are thinkable. Other configurations are also thinkable for this application. Beside the medium diameter of quantum dots 93a and 93b other physical and/or chemical properties of any type of nanostructures 93a and 93b can be employed, and any suitable measurements other than photoluminescence to distinguish the two sets of nanostructures 93a and 93b may be employed as measurement method.

Although the present invention has been described in the above by way of preferred embodiments, it is not limited thereto, but rather can be modified in a wide range of ways. In particular, the invention can be changed or modified in various ways without deviating from the core of the invention.

LIST OF USED REFERENCE SYMBOLS 10 wafer
11 substrate
11a, 11b surfaces of the substrate 11
11c, 11d sides of the substrate 11
12 basic intermediate layer
13 covering intermediate layer
14 outer intermediate layer
15 outer surface of outer intermediate layer 14
15a, 15b areas of the outer surface 15
15a positions of growth/positions of modification
16 nanostructures
20 wafer
21 basic intermediate layer
22 inhomogeneities
23 molecular beam
24 material source
25 shutter device
26 covering intermediate layer
27 positions of growth
28 nanostructures
30 wafer
40 wafer
41 shadow mask
42 openings of the shadow mask 41
43 material depositions 44 basic intermediate layer
45 inhomogeneities
45 positions of growth
50 wafer
51 second covering intermediate layer
52 positions of growth
53 nanostructures
60 wafer
61 wetting layer
61a altered subareas of the wetting layer 61
61b remaining subareas of the wetting layer 61
70 Optical Emission Device
71 wafer
72 housing
73 optical beam
74 opening of the housing 72
80 wafer
81 material source
82 molecular beam
83 basic intermediate layer
84 areas of enhanced roughness
84 positions of growth
85 bright fringes
86 dark regions
90 wafer
91a first plurality of nanostructures
91b second plurality of nanostructures
92a first covering intermediate layer
92b second covering intermediate layer
93a first plurality of nanostructures
93b second plurality of nanostructures
94a spacing intermediate layer
94b spacing intermediate layer
h1 first medium height
h2 second medium height

The invention claimed is:

1. A wafer comprising:
a substrate; and
at least one intermediate layer formed on a surface of the substrate, wherein the at least one intermediate layer covers the surface of the substrate at least partially, and wherein an outer surface of the at least one intermediate layer is directed away from the surface of the substrate, wherein the at least one intermediate layer is formed in such a way that positions of growth of nanostructures are predetermined on the outer surface of the at least one intermediate layer, so that at least one nanostructure material of the nanostructures is assembled at the positions of growth of the nanostructures,
wherein the at least one intermediate layer is formed in such a way that the outer surface has a varying roughness with a first number of areas of the outer surface having a higher roughness and a second number of areas of the outer surface having a lower roughness than the roughness of said first number of areas, wherein the difference between the surface roughnesses of the first and second number of areas is caused by different densities of steps of atomic monolayers in the respective first and second number of areas, and
wherein the nanostructures are positioned at the first number of areas of the outer surface having a higher roughness and areas therebetween are free of the nanostructures.

2. The wafer according to claim 1, wherein the at least one intermediate layer comprises a stack of at least two layers, wherein the at least two layers each have a varying layer thickness perpendicular to the surface of the substrate, and wherein a thickness of the stack perpendicular to the surface of the substrate is constant.

3. The wafer according to claim 2, wherein the at least one intermediate layer comprises a layer with a periodically or arbitrarily varying layer thickness perpendicular to the surface of the substrate.

4. The wafer according to claim 1, wherein the at least one intermediate layer comprises a layer with a periodically or arbitrarily varying layer thickness perpendicular to the surface of the substrate.

5. The wafer according to claim 1, wherein the nanostructures comprise nano-islands, droplets, nano-dashes, nano-rings, nano-posts, nano-wires, nano-ribbons, nano-rods, nano-pillars, quantum dots, biological cells and/or biomolecules.

6. The wafer according to claim 1, wherein:
the wafer is included with an optical emission device, and
the optical emission device is a laser, an LED, a superradiant LED, or a single photon source.

* * * * *